United States Patent [19]

Matsumoto et al.

[11] Patent Number: 4,603,343
[45] Date of Patent: Jul. 29, 1986

[54] SOLID STATE IMAGE SENSOR APPLIED WITH DIFFERING READ-OUT GATE VOLTAGES

[75] Inventors: Hiroyuki Matsumoto; Yoshimi Hirata, both of Atsugi, Japan

[73] Assignee: Sony Corporation, Tokyo, Japan

[21] Appl. No.: 523,589

[22] Filed: Aug. 16, 1983

[30] Foreign Application Priority Data

Aug. 17, 1982 [JP] Japan ................................ 57-142339

[51] Int. Cl.⁴ .................... H01L 29/78; H04N 3/14; H04N 5/335
[52] U.S. Cl. ........................................ 357/24; 358/213
[58] Field of Search ............... 357/24 LR; 377/61; 358/213, 212

[56] References Cited

U.S. PATENT DOCUMENTS 3,715,485  2/1973  Weimer ..................... 357/24 LR
4,242,599  12/1980  Suzuki ........................... 357/24

FOREIGN PATENT DOCUMENTS 5772473  5/1982  Japan ............................... 358/213

*Primary Examiner*—Andrew J. James
*Assistant Examiner*—R. P. Limanek

[57] ABSTRACT

A solid state image sensor is disclosed which includes a photosensitive region consisting of a group of first vertical shift registers formed of a plurality of charge transfer devices, light receiving areas, which are located between adjacent ones of the group of first vertical shift registers, electrically separated from one other by a channel stop region and capable of accumulating a charge, and read-out gate sections transferring signal charges of the light receiving areas to corresponding one of the first vertical shift registers, a storage section consisting of a group of second vertical shift registers electrically connected to one end of the vertical shift registers, a charge transfer horizontal shift register electrically connected to one end of the second vertical shift registers, and a section for field-reading out the signal charges in the photosensitive areas, the potentials of the read-out gate sections during the light receiving and accumulating period are selected to be different between the periods before and after the vertical blanking period during which a signal of an opposite field is read out whereby a processing charge proportional to the amount of light impinging on receiving areas during the preceding period is made smaller than that during the succeeding period.

2 Claims, 4 Drawing Figures

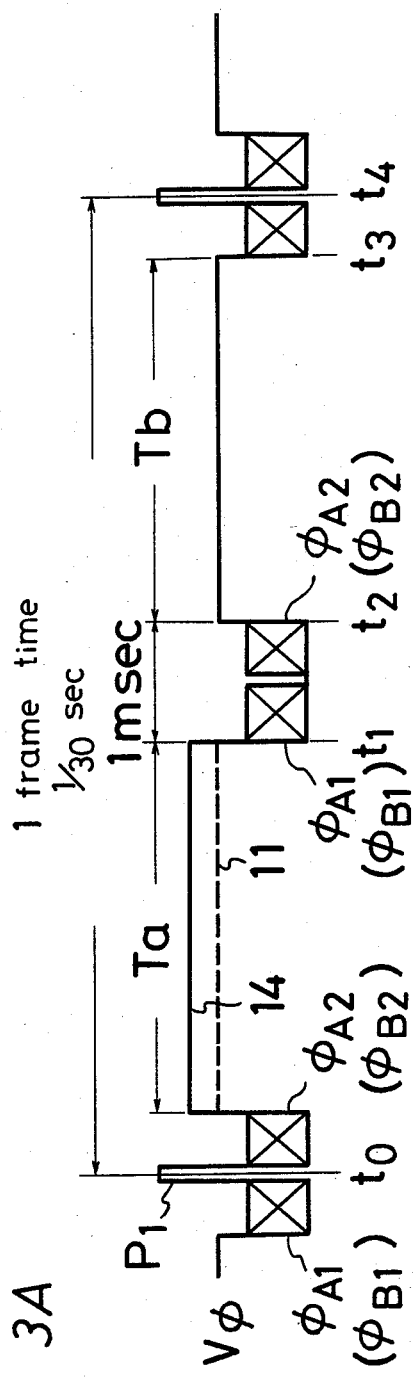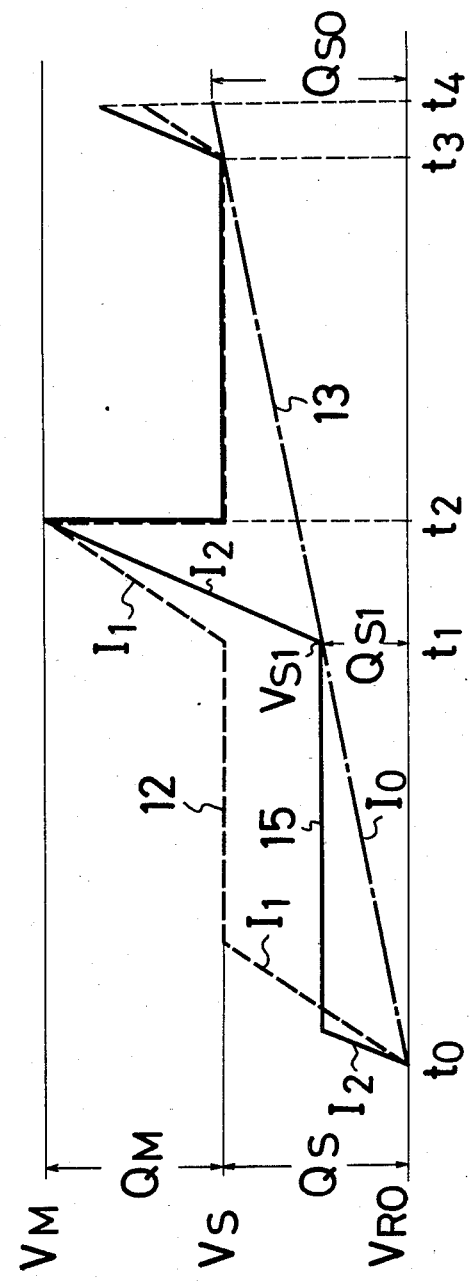

SOLID STATE IMAGE SENSOR APPLIED WITH DIFFERING READ-OUT GATE VOLTAGES

BACKGROUND OF THE INVENTION

1. Field of the Invention

The present invention relates generally to solid state image sensors and more particularly is directed to an improvement of a solid state image sensor previously proposed by the same assignee by which blooming suppressing effect can be increased and the dynamic range can be raised.

2. Description of the Prior Art

The outline of the previously proposed solid state image sensor will be described with reference to FIG. 1. As shown in FIG. 1, this solid state image sensor is formed of a photosensitive region 3 having a group of plural vertical shift registers 1 each formed of a charge transfer device, for example, a CCD (charge coupled device), a plurality of light receiving areas 2, each of which is located between adjacent vertical shift registers 1 and correspond to each picture element and is capable of accumulating a charge. Read-out gate sections 7 are provided, each of which transfers a signal charge of each light receiving area 2 to one side thereof, namely, the corresponding vertical shift register 1. Also provided are a memory or storage section 5 having a group of vertical shift registers 4 similarly formed of CCDs, each of which is electrically connected to one end of each vertical shift register 1 within the photosensitive region 3 and a horizontal shift register 6 of the same CCD, which is coupled to the storage section 5. In the vertical shift register 1, the transfer electrodes of the transfer section corresponding to each light receiving area 2 are connected together at every other or every field (odd fields or even fields) to which two-phase clock voltages $V_{\phi A}$ and $V_{\phi B}$ are applied. The electrode of each read-out gate section 7 is formed the same as that of, for example, the transfer electrode of the corresponding vertical shift register 1 receives the same potential as that applied to the transfer electrode of the vertical shift register 1. Reference numeral 8 designates a channel stop region which is formed to separate each vertical line and each light receiving area 2. Portions other than the light receiving area 2 are all masked to shield them from light.

With such a solid image sensor, the signal charge accumulated in the light receiving area 2 during the light receiving and accumulating period is transferred from the light receiving area 2 to the vertical shift register 1 via the read-out gate section 7 during every field during the vertical blanking period, then are transferred therefrom to the storage section 5 at higher speed and then are stored therein. Thereafter, the signal charge of one horizontal line each is transferred from the storage section 5 to the horizontal shift register 6 during each horizontal scanning period and then the signal charge of one picture element is read out from the output terminal sequentially. In this solid state image sensor, the signal charge received by the light receiving area 2 is read out to the light-shielded vertical shift register 1, then is transferred from the vertical shift register 1 to the storage section 5 at high speed and then the signal charge stored in the storage section 5 is supplied through the horizontal shift register 6 during each horizontal line. Therefore, there is an advantage in that the picture quality can be prevented from being deteriorated by so-called smear.

The ordinary drive method of this solid state image sensor will be described with reference to a timing chart of FIG. 2. In the figure, reference letter $T_0$ designates the vertical blanking period and $V_{\phi A}$ and $V_{\phi B}$ two-phase clock voltages applied to the transfer electrodes of the vertical shift register 1.

As shown in FIG. 2, in the field to be read out, the vertical shift register 1 is driven in response to transfer clock signals $\phi_{A1}$ and $\phi_{B1}$ during the first period of the corresponding vertical blanking period $T_0$ to thereby transfer or discharge undesired charge remaining in the vertical shift register 1 therefrom (this transfer of signal charge is called the discharge-transfer). During the next period after the discharge-transfer of the undesired charge, a read pulse $P_1$ is applied to one of the transfer electrodes of the vertical shift register 1 to open the read-out gate section 7 corresponding to the light receiving area 2 of the field to be read whereby to transfer the signal charge from the light receiving area 2 to the vertical shift register 1 (this transfer of signal charge is called a read-out transfer). During the subsequent period, the transfer clock signals $\phi_{A2}$ and $\phi_{B2}$ are applied to the vertical shift register 1 to thereby transfer the signal charge from the vertical shift register 1 to the storage section 5 (this transfer is called a frame-shift transfer). Thereafter, the solid state image sensor operates in the light receiving and accumulating period. Meanwhile, during the light receiving and accumulating period (the period other than the vertical blanking period during which the signal of the opposite field is read out), the vertical shift register 1 in the photosensitive region 3 is used as an overflow drain region. In this case, during, for example, such period, a constant voltage is applied to the vertical shift register 1 to extract the charges which overflow from the light receiving area 2 to the vertical shift register 1 over the read-out gate section 7 during the light receiving and accumulating period. Here, the opposite field, if it is a one frame light receiving and accumulating period of the odd field (or even field), represents the opposite even field (or odd field). When the vertical shift register 1 is used as the overflow drain region, in addition to supplying the constant voltage to the vertical shift register 1, it is also possible that the vertical shift register 1, for example, is driven by the clock signal to transfer and extract the overflow charge.

Thus, it can be assumed that in the solid state image sensor of such system the vertical shift register 1 can process sufficient charges. Then, during the vertical blanking period of the opposite field (the duration of time required for the so-called discharge transfer, the read-out transfer and the frame-shift transfer) during the one frame light receiving and accumulating period, the vertical shift register 1 is not utilized as the overflow drain region so that limiting of the blooming control is determined by the amount of light received within the vertical blanking period of the opposite field and which overflows from the light receiving area 2. The prior art for limiting the conventional blooming control will be described with reference to broken lines 11 and 12 in FIGS. 3A and 3B. FIG. 3A is a timing chart showing a clock voltage $V_\phi$ ($V_{\phi A}$ and $V_{\phi B}$) applied to the vertical shift register 1 (the same clock voltage is applied to the read-out gate section 7). FIG. 3B shows the potential in the light receiving area 2 which charges depend on the amount of light signal, namely, the amount of signal charge wherein reference letters $V_{R0}$, $V_S$ and $V_M$ respectively represent the potential during the read-out operation of the read-out gate section 7, upon receiving the light and during the vertical blanking period through which the signal charge of the opposite field is read out. In the prior art, since the voltage $V_{100}$ applied to the read-out gate section 7 during the one field light receiving and accumulating period is constant as shown by the broken line 11 in FIG. 3A during the periods other than during the vertical blanking period of the opposite field, the potential of the read-out gate section 7 becomes the constant potential $V_S$ during the periods before and after the vertical blanking period of the opposite field. Accordingly, when a light of high intensity is received by the light receiving area 2, the potential of the light receiving area 2 becomes the potential $V_S$ immediately before the vertical blanking period of the opposite field. Therefore, if $Q_M$ is taken as the amount of that can be accumulated during the vertical blanking period of the opposite field (duration of time required for the discharge transfer, the read-out transfer and the frame-shift transfer), namely, a so-called tolerance limit amount of charge, an amount of light 1, is the limit of the blooming control as shown by the broken line 12 in FIG. 3B.

Thus, if the amount or charge to be processed is taken as $Q_S$ and the tolerance limit amount of charge is taken as $Q_M$, under the condition that the potential of the read-out gate section 7 during the one frame light receiving and accumulating period is constant, the blooming suppressing effect K of the previously proposed solid state image sensor is determined by the following expression.

$$K = \frac{\text{one frame time}}{\text{discharge transfer time} + \text{frame shift transfer time} + \text{read out transfer time}} \times \frac{Q_M}{Q_S} \quad (1)$$

OBJECTS AND SUMMARY OF THE INVENTION

Accordingly, it is an object of the present invention to provide a solid state image sensor which can obviate the afore-said defects inherent in the conventional solid state image sensor.

It is another object of the present invention to provide a solid state image sensor which can suppress blooming and which can raise the dynamic range.

According to one aspect of the present invention, there is provided a solid state image sensor comprising:

a photosensitive region consisting of a group of first vertical shift registers formed of a plurality of charge transfer devices, light receiving areas, which are located between adjacent one of said group of first vertical shift registers and are, electrically separated from one other by channel stop means and capable of accumulating a charge, and read-out gate sections for transferring signal charges of said light receiving areas to corresponding ones of said first vertical shift registers;

a storage section consisting of a group of second vertical shift registers electrically connected to one end of said vertical shift registers;

a charge transfer horizontal shift register electrically connected to one ends of said second vertical shift registers; and means for assuring that during field-reading out the signal charges in said photosensitive areas, the potentials of said read-out gate sections during the light receiving and accumulating period are made to be different between the periods before and after the vertical blanking period during which a signal of an opposite field is read out whereby a processing amount of charge by said light receiving areas during said preceding period is made to be smaller than that during said succeeding period.

The other objects, features and advantages of the present invention will become apparent from the following description taken in conjunction with the accompanying drawings through which the like references designate the same elements and parts.

BRIEF DESCRIPTION OF THE DRAWINGS

FIGS. 3A and 3B are respectively a timing chart and a diagram showing the change of potential depending on a light signal useful for explaining an embodiment of a solid state image sensor according to the present invention.

DESCRIPTION OF THE PREFERRED EMBODIMENT

Now, an embodiment of a solid state image sensor according to the present invention will be described hereinafter.

Figure 1:
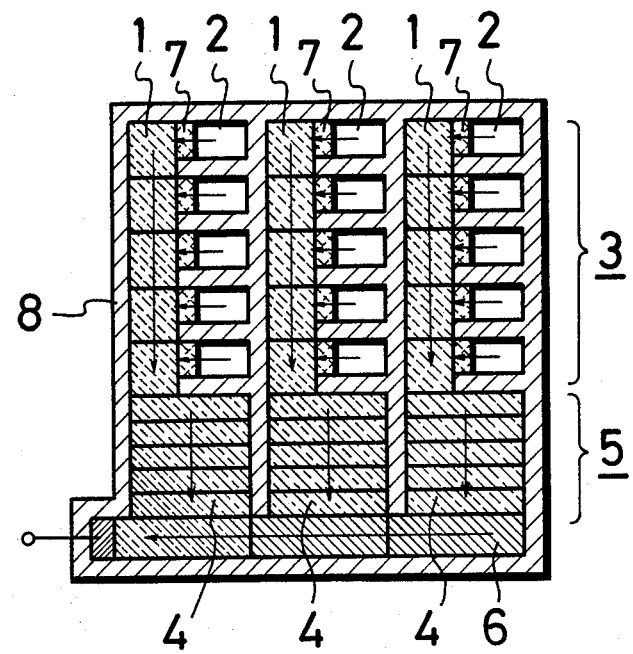
FIG. 1 is a diagram showing an outline of a solid state image sensor which can be applied to the present invention.
Figure 2:
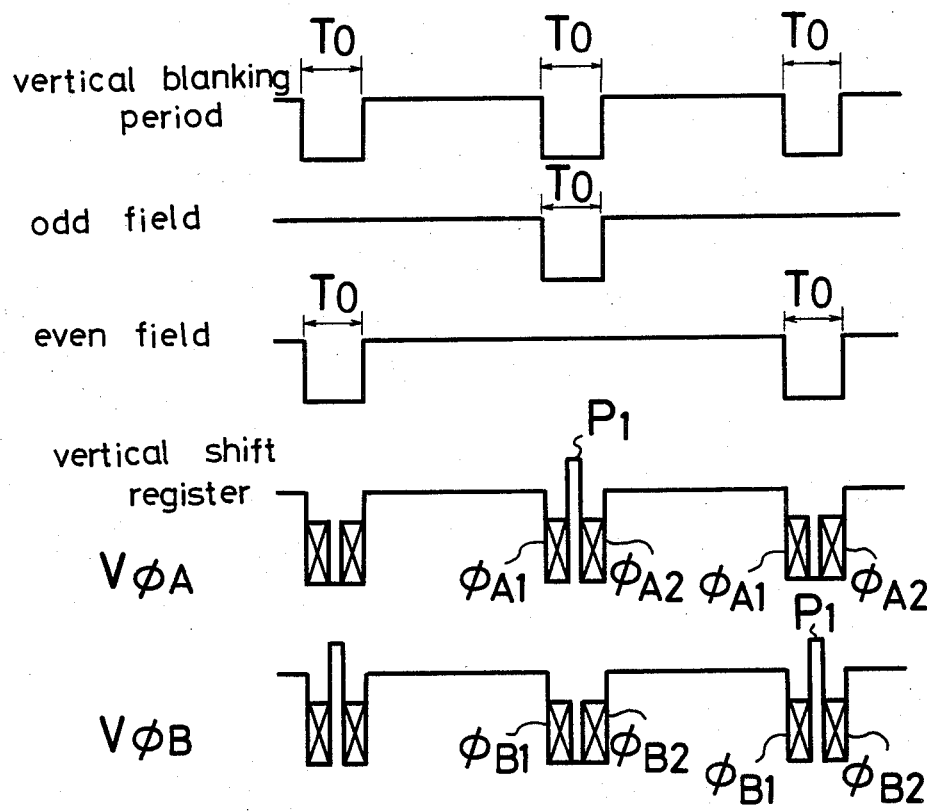
FIG. 2 is a timing chart useful for explaning the operation thereof.

In the same way as the sensor shown in FIG. 1, a solid state image sensor of the present invention is formed of the photosensitive region 3 having a group of plural vertical shift registers 1 formed of CCDs, as well as the plurality of light receiving areas 2, each of which is separated with one another between the vertical shift registers 1 by the channel stop region 8 mounted between the vertical shift registers 1 are capable of accumulating a charge. Read-out gate sections 7 are provided, each of which transfers the signal charge of the light receiving area 2 to the vertical shift register 1. The memory or storage section 5 has a group of vertical shift registers 4 also formed of CCDs, each of which is electrically connected to one end of each vertical shift register 1 within the photosensitive region 3. The horizontal shift register 6 of the same CCD are coupled to the storage section 5 to read out the signal charges therefrom. In this case, according to the present invention, the potential of the read-out gate section 7 during the light receiving and accumulating period is made to be different from each other between the respective periods before and after the vertical blanking period so that the signal charge of the opposite field is read out, and the processed amount of charge in the light receiving area 2 during the preceding period is selected to be smaller than that during the following period.

More specifically, as shown in FIG. 3B, the effective amount of light received in the light receiving area 2 during one frame light receiving and accumulating period has an intensity which does not cause any overflow at time $t_3$ as shown by $I_0$ (indicated as one-dot chain line 13). Thus, the effective maximum amount of signal charge accumulated in the light receiving area 2 at time $t_1$ just before the vertical blanking period of the opposite field is represented as $Q_{S1}$. At this time, it is not necessary that the light receiving area 2 accumulates more signal charge to cause its potential to become the potential $V_{S1}$. Therefore, in accordance with the present invention, as shown by a solid line 14 in FIG. 3A, the voltage $V_\phi$ applied to read-out gate section 7 during the one field light receiving and accumulating period is selected to be different during a period $T_a$ preceding the vertical blanking period of the opposite field from what it is during a period $T_b$ following the vertical blanking period. In other words, as shown by a solid line 15 in FIG. 3B, the potentials of the read-out gate section 7 are respectively controlled to become $V_{S1}$ and $V_S$ in such a manner that during the preceding period $T_a$, the processed amount of charge accumulated in the light receiving area 2 is limited to the effective maximum signal amount of charge $Q_{S1}$ at time $t_1$, while during the later period $T_b$, it is limited to the maximum processing amount of charge $Q_S$.

Thus, since the potential of the read-out gate section 7 is $V_{S1}$ at time $t_1$ just before the vertical blanking period of the opposite field, the tolerance limit amount of charge which can be accumulated in the light receiving area 2 during the vertical blanking period of the opposite field can be the amount of light energy $I_2$. Thus, the tolerance limit amount of charge at that time is expressed as $\{Q_M+(Q_S-Q_{S1})\}$. The absolute amount thereof is determined by the timing of the scanning system. Since $Q_{S1} \approx \frac{1}{2} Q_S$, the blooming suppressing effect K is expressed as $$K = \frac{\text{one frame time}}{\text{discharge transfer time} + \text{read-out transfer time} + \text{frame shift transfer time}} \times \frac{Q_S + Q_M - Q_{S1}}{Q_{S0}} = \text{Eq. (1)} \times 1.5$$

EXAMPLE $$Q_{S1} = \frac{t_1}{t_3} \times Q_S \approx \frac{16.65 - 0.5}{33.3 - 0.5} Q_S = 0.49 Q_S$$

$$K = \frac{\frac{1}{30} \times (Q_{S0} + Q_M - Q_{S1})}{\frac{1}{600} K \times 250 \times 2 \times Q_{S0}} \approx 40 \times 1.5 = 60 \text{ (times)}$$

where one frame time is 1/30 sec, the number of vertical picture elements is 500, the frame shift frequency is 600K cycle, and since the read out transfer time is extremely short, it can be neglected. Thus, if the frame shift frequency is selected to be the same as in the prior art and $Q_M$ is also selected to be the same as in the prior art, the solid state image sensor of the present invention can increase the blooming suppressing effect 1.5 times that of the prior art.

As set forth above, according to the present invention, the blooming suppressing effect of the solid state image sensor can be increased and the dynamic range thereof can be raised in a simple manner by making the potential of the read-out gate section 7 different between the periods before and after the vertical blanking period of the opposite field during the light receiving and accumulating periods.

The above description is given for a single preferred embodiment of the invention, but it will be apparent that many modifications and variations could be effected by one skilled in the art without departing from the spirit or scope of the novel concepts of the invention, so that the scope of the invention should be determined only by the appended claims.

We claim as our invention:
1. A solid state image sensor comprising:
a photosensitive region consisting of a plurality of first vertical shift register regions formed of a plurality of charge transfer devices, a plurality of first light receiving areas with each of said areas located adjacent one of said first plurality of vertical shift register regions, said plurality of first light receiving areas, electrically separated from each other by channel stop means and capable of accumulating a charge, and a first plurality of read-out gate sections mounted between said plurality of first light receiving areas and said first plurality of vertical shift register regions for transferring signal charges from said light receiving areas to corresponding ones of said first vertical shift register regions;
a storage section consisting of a plurality of second vertical shift register regions electrically connected to receive charges from said vertical shift register regions,
a charge transfer horizontal shift register electrically connected to receive charges from said second vertical shift register regions; and
means for applying voltages to said read-out gate sections during the light receiving and accumulating periods which are different between the periods before and after the vertical blanking period during which a signal of an opposite field is read out whereby the amount of charge in said light receiving areas during said preceding period is smaller than during said succeeding period.
2. A solid state image sensor according to claim 1, wherein the amount of charge in said light receiving areas during said preceding period is selected to be approximately one half the charge during the succeeding period.

* * * * *